United States Patent
Limdulpaiboon et al.

(10) Patent No.: US 8,987,143 B2
(45) Date of Patent: Mar. 24, 2015

(54) HYDROGEN PLASMA CLEANING OF GERMANIUM OXIDE SURFACES

(71) Applicant: Intermolecular, Inc., San Jose, CA (US)

(72) Inventors: Ratsamee Limdulpaiboon, San Jose, CA (US); Chi-I Lang, Cupertino, CA (US); Sandip Niyogi, San Jose, CA (US); J. Watanabe, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/031,975

(22) Filed: Sep. 19, 2013

(65) Prior Publication Data

US 2014/0273493 A1  Sep. 18, 2014

Related U.S. Application Data

(60) Provisional application No. 61/779,740, filed on Mar. 13, 2013.

(51) Int. Cl.
| | |
|---|---|
| H01L 21/302 | (2006.01) |
| H01L 21/02 | (2006.01) |
| H01L 29/66 | (2006.01) |
| H01L 27/146 | (2006.01) |
| H01L 21/283 | (2006.01) |
| H01L 29/41 | (2006.01) |
| H01L 21/3065 | (2006.01) |
| H01L 29/778 | (2006.01) |
| H01L 29/16 | (2006.01) |

(52) U.S. Cl.
CPC .... *H01L 21/02005* (2013.01); *H01L 29/66477* (2013.01); *H01L 27/1462* (2013.01); *H01L 27/14643* (2013.01); *H01L 27/14698* (2013.01); *H01L 21/283* (2013.01); *H01L 29/41* (2013.01); *H01L 21/02104* (2013.01); *H01L 21/3065* (2013.01); *H01L 21/02178* (2013.01); *H01L 21/02181* (2013.01); *H01L 21/02189* (2013.01); *H01L 21/02205* (2013.01); *H01L 21/0228* (2013.01); *H01L 29/778* (2013.01); *H01L 29/1606* (2013.01)
USPC ............. 438/723; 216/58; 216/67; 216/72; 438/706; 438/710; 438/714; 438/767

(58) Field of Classification Search
USPC ........ 216/58, 67, 72; 438/714, 706, 710, 723, 438/724, 767, 797
See application file for complete search history.

(56) References Cited

U.S. PATENT DOCUMENTS

| | | | |
|---|---|---|---|
| 4,361,461 A | 11/1982 | Chang | |
| 6,613,695 B2 * | 9/2003 | Pomarede et al. | 438/767 |
| 6,811,448 B1 | 11/2004 | Paton et al. | |

(Continued)

OTHER PUBLICATIONS

International Search Report and Written Opinion for PCT Application No. PCT/US2014/026732 mailed on Jul. 7, 2014.

*Primary Examiner* — Lan Vinh
*Assistant Examiner* — Maki Angadi

(57) ABSTRACT

Methods and apparatus for processing using a remote plasma source are disclosed. The apparatus includes an outer chamber enclosing a substrate support, a remote plasma source, and a showerhead. A substrate heater can be mounted in the substrate support. A transport system moves the substrate support and is capable of positioning the substrate. The plasma system may be used to generate activated hydrogen species. The activated hydrogen species can be used to etch/clean semiconductor oxide surfaces such as silicon oxide or germanium oxide.

20 Claims, 11 Drawing Sheets

(56) References Cited

U.S. PATENT DOCUMENTS

| | | | |
|---|---|---|---|
| 6,946,368 B1 * | 9/2005 | Vandroux et al. | 438/475 |
| 7,053,002 B2 * | 5/2006 | Cohen et al. | 438/714 |
| 7,604,708 B2 | 10/2009 | Wood et al. | |
| 2005/0208756 A1 | 9/2005 | Matsushita et al. | |
| 2007/0107750 A1 | 5/2007 | Sawin et al. | |
| 2009/0029529 A1 | 1/2009 | Shin | |
| 2011/0230052 A1 | 9/2011 | Tang et al. | |
| 2014/0011339 A1 | 1/2014 | Zheng et al. | |

* cited by examiner

|  | Range | Advantageous Range |
| --- | --- | --- |
| Temperature (C) | 25 - 500 | 100 - 300 |
| Ar flow rate (sccm) | 10 - 1000 | 250 - 750 |
| H2 flow rate (sccm) | 10 - 100 | 10 - 50 |
| Pressure (Torr) | .05 - 5 | .05 - 2 |
| Time (min) | .25 - 60 | 5 - 40 |

FIG. 5

HYDROGEN PLASMA CLEANING OF GERMANIUM OXIDE SURFACES

CROSS-REFERENCE TO RELATED APPLICATIONS

This application claims priority to U.S. Provisional Application No. 61/779,740, filed on Mar. 13, 2013, which is herein incorporated by reference for all purposes.

TECHNICAL FIELD

The present disclosure relates generally to methods and apparatuses for processing using a remote plasma source for surface treatment, cleaning, and layer formation.

BACKGROUND

Plasmas are widely used for a variety of treatment and layer deposition tasks in semiconductor fabrication and other thin film applications. These applications include subtractive processes such as wafer precleaning, contaminant removal, native oxide removal, photoresist removal, plasma etching, as well as treatment processes such as oxidation, nitridation, or hydridation of a layer both during and after formation. "Remote" plasma sources are frequently used, where the plasma is located at some distance from the surface to be treated or substrate on which a layer is being formed. The distance allows some filtering of the charged particles in the plasma. For example, the density of electrons and ions can be adjusted or removed from the generated plasma.

Logic devices are increasingly using germanium-based layers as the semiconductor channel in advanced transistors. The germanium-based layers may include germanium or silicon-germanium alloys. Germanium oxidizes more easily than silicon when exposed to ambient conditions. Further, the germanium oxides exhibit reduced stability when compared to the silicon oxides. Typically, these oxides must be removed before the formation of the transistor gate stack and/or the source and drain contacts to the transistor.

What is needed is a system and methods that enable the in-situ removal of native oxide such as the use of direct or remote plasmas to remove oxide layers present on semiconductor surfaces prior to further processing.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and apparatus for processing using a remote plasma source for the cleaning of semiconductor oxide (e.g. $GeO_x$, $SiO_x$, Ge—Si—$O_x$) surfaces are disclosed. The apparatus includes an outer chamber enclosing a substrate support, a plasma source (either a direct plasma or a remote plasma), and a showerhead. Other gas distribution and gas dispersal hardware may also be used. A substrate heater can be mounted in the substrate support. A transport system moves the substrate support and is capable of positioning the substrate. The remote plasma source may be used to generate activated species operable to remove semiconductor oxide layers. Further, the remote plasma source may be used to generate activated species operable to provide a passivation of the cleaned semiconductor surface.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 5 provides a table of process parameters according to some embodiments.

DETAILED DESCRIPTION

Figure 1:
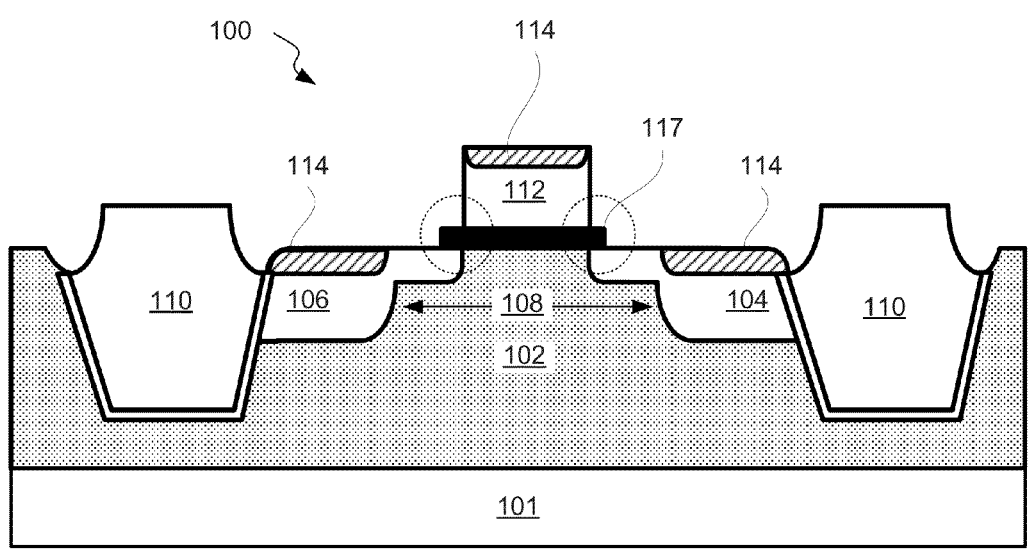
FIG. 1 illustrates a cross-sectional schematic diagram of a typical semiconductor device.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "and" and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, germanium, silicon-germanium alloys, gallium arsenide, indium gallium arsenide, indium gallium antimonide, silica, sapphire, zinc oxide, silicon carbide, aluminum nitride, Spinel, coated silicon, silicon on oxide, silicon carbide on oxide, glass, gallium nitride, indium nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

The term "remote plasma source" as used herein refers to a plasma (e.g., an rf or microwave generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

Scaling of the gate lengths and equivalent gate oxide thicknesses is forcing the replacement of silicon dioxide as a gate dielectric by materials having high-dielectric constants (i.e., high-k materials). The goals include reduction of leakage currents and meeting requirements of reliability. Some additional consideration in selecting suitable replacement materials include silicon related band offsets, permittivity, dielectric breakdown strength, interface stability and quality with silicon, and the effective masses of the carriers.

Hafnium oxide is a candidate for silicon dioxide replacement as a gate dielectric material. It has a dielectric constant of about 25 at room temperature or about six times greater than that of silicon dioxide. While this dielectric constant is more than an order of magnitude smaller than for strontium titanium oxide ($SrTiO_3$), which has a dielectric constant of about 300, hafnium oxide has a conduction band offset of about 1.5-2.0 eV with respect to silicon, which is more than one order of magnitude higher than that of strontium titanium oxide.

The same properties of hafnium oxide that make it a leading candidate for a gate dielectric application also give hafnium oxide a high potential for other applications, such as insulating dielectrics in capacitive elements of various memory devices or, more specifically, of dynamic random-access memory (DRAM) capacitor stacks. Because of its high dielectric constant, a thick layer of hafnium oxide can be used to achieve the same performance as a much thinner silicon dioxide layer. However, thicker hafnium oxide layers have much lower leakage currents in comparison with thinner silicon oxide layers. In addition to having a high dielectric constant, hafnium oxide is thermodynamically stable with respect to silicon, with which it may be in contact in many semiconductor applications. Many modern complementary metal-oxide-semiconductor (CMOS) and DRAM processes involve high temperatures (e.g., 1000° C.) that are applied to substrates for a few seconds. Other applications of hafnium oxide include optical coatings, catalysts, and protective coatings (due to its hardness and thermal stability).

Hafnium oxide layers or structures may be deposited by a variety of physical vapor deposition (PVD) methods, including laser pulse ablation and sputtering. Other deposition techniques include CVD using β-diketonate precursors, alkoxide precursors, and chloride precursors. Atomic layer deposition (ALD) techniques may be used to prepare layers using both chloride and iodide precursors. Different deposition techniques yield different layer structures that may have different susceptibilities to etching.

Metal layers may be converted to metal compounds by the reaction with ions or reactive neutral species to form metal oxides, metal nitrides, metal carbides, metal silicides, metal chlorides, metal fluorides, and the like. These metal compounds may be used as diffusion barriers, local conductors, adhesion layers, work function (WF) tuning layers, and the like. The ions and/or reactive neutral species may be formed using a remote plasma source.

Semiconductor Device Examples

A brief description of semiconductor device examples is presented below to provide better understanding of various plasma surface treatments. Specifically, FIG. 1 illustrates a schematic representation of substrate portions including MOS device, 100, in accordance with some embodiments. The references below are made to positive metal-oxide semiconductor (PMOS) devices but other types of MOS devices can be used in the described processes and will be understood by one having ordinary skill in the art. MOS device 100 includes a p-doped substrate, 101, and an n-doped well, 102, disposed within substrate, 101. Substrate, 101, is typically a part of an overall wafer that may include other devices. Some of these devices may include silicon nitride, silicon oxide, polysilicon, or titanium nitride structures. P-doped substrate, 101, may include any suitable p-type dopants, such as boron and indium, and may be formed by any suitable technique. N-doped well, 102, may include any suitable n-type dopants, such as phosphorus and arsenic, and may be formed by any suitable technique. For example, n-doped well, 102, may be formed by doping substrate, 101, by ion implantation, for example.

MOS device, 100, also includes a conductive gate electrode, 112, that is separated from n-doped well, 102, by gate dielectric, 117. Gate electrode, 112, may include any suitable conductive material. In some embodiments, gate electrode, 112, may comprise polysilicon. In some embodiments, gate electrode, 112, may include polysilicon doped with a p-type dopant, such as boron. Gate dielectric, 117, is formed from a high-k material (e.g. hafnium oxide). Other dielectric materials include zirconium oxide or aluminum oxide. Typically, a semiconductor material with high mobility such as germanium or a silicon-germanium alloy (not shown) is formed beneath the gate dielectric.

MOS device, 100, also includes p-doped source region, 104, and drain region, 106, (or simply the source and drain) disposed in n-doped well, 102. Source, 104, and drain, 106, are located on each side of gate electrode, 112, forming channel, 108, within n-doped well, 102. Source, 104, and drain, 106, may include a p-type dopant, such as boron. Source, 104, and drain, 106, may be formed by ion implantation. After forming source, 104, and drain, 106, MOS device, 100, may be subjected to an annealing and/or thermal activation process.

In some embodiments, source, 104, drain, 106, and gate electrode, 112, are covered with a layer of self-aligned silicide portions, 114, which may be also referred to as salicide portions or simply salicides. For example, a layer of cobalt may be deposited as a blanket layer and then thermally treated to form these silicide portions, 114. Other suitable materials include nickel and other refractory metals, such as tungsten, titanium, platinum, and palladium. After forming the blanket layer from the suitable metal, the layer is subjected to rapid thermal process (RTP) to react the metal with silicon contained within gate electrode, 112, as well as within source, 104, and drain, 106, to form a metal silicide. The RTP process may be performed at 700° C. to 1000° C.

MOS device, 100, may also include shallow trench isolation (STI) structures, 110, disposed on both sides of source, 104, and drain, 106. STI structures, 110, may include liners formed on the side and bottom walls by, for example, thermal oxidation of silicon of n-doped well, 102. The main body of STI structures is formed by filling a trench within n-doped well, 102, with a dielectric material, such as silicon oxide. Silicon oxide may be filled using high density plasma (HDP) deposition process.

As shown in FIG. 1, gate dielectric, 117, may protrude beyond gate electrode, 112. As such, gate dielectric, 117, may need to be partially etched such that it does not extend past electrode, 112, and does not interfere with subsequent formation of liners and spacers on sidewalls of gate electrode, 112.

In some embodiments, the gate dielectric, 117, and/or the gate electrode, 112, may receive a surface plasma treatment to improve the performance of the device.

Figure 2:
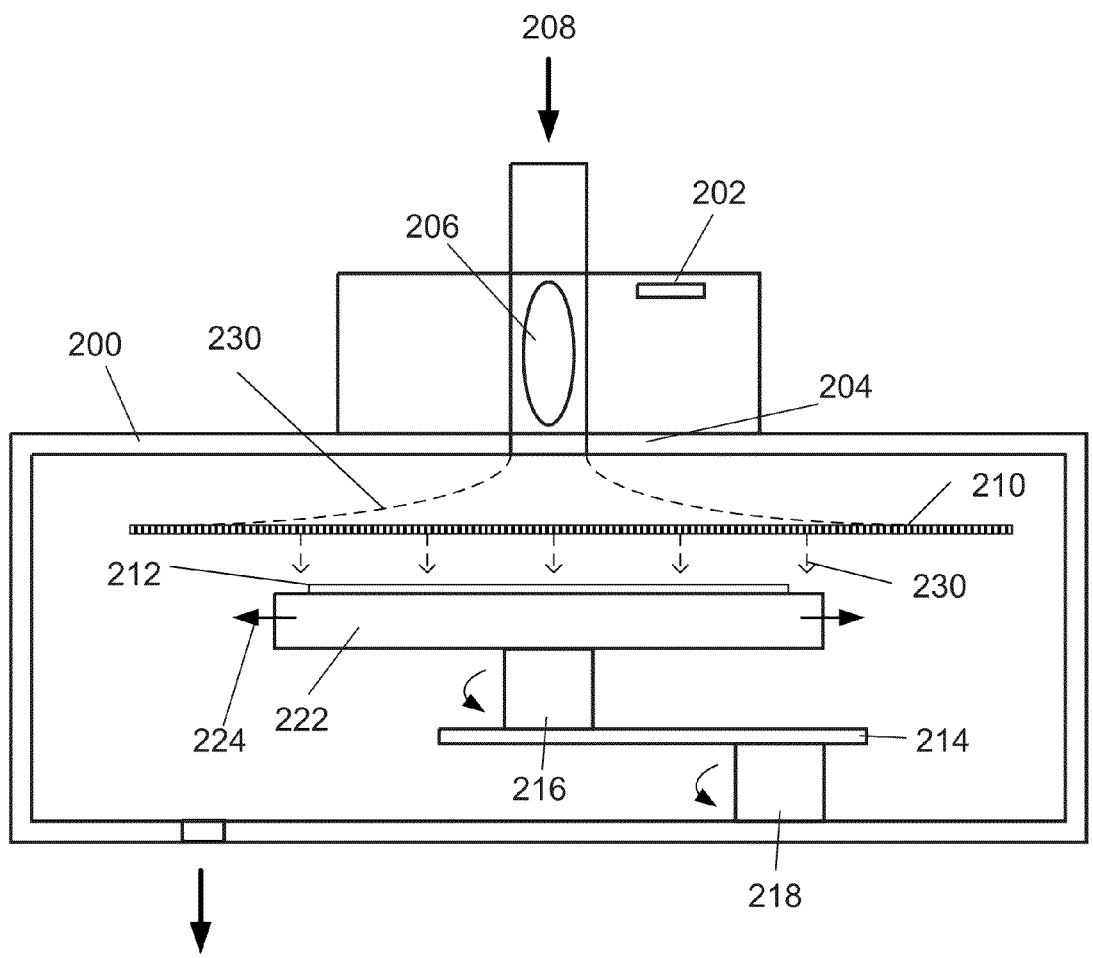
FIG. 2 illustrates a schematic diagram for plasma surface treatment according to some embodiments.

FIG. 2 illustrates the overall layout of some embodiments of a system enabling combinatorial processing using a remote plasma source. A discussion of the system may be found in co-owned U.S. patent application Ser. No. 13/328,129 filed on Dec. 16, 2011 which is herein incorporated by reference for all purposes. Portions of the '129 application are included herein to enhance the understanding of the present disclosure. A process chamber, 200, is provided. A remote plasma source, 202, is mounted on a chamber lid, 204, either directly as illustrated or through a short flange. The plasma, 206, is entrained into a central gas flow, 208, which is directed toward a showerhead, 210. The showerhead is disposed within the processing chamber between the remote plasma source and the substrate and is in close proximity to the substrate, 212. The showerhead further includes multiple regions, each region containing an inert gas port. The showerhead is operable to provide exposure of reactive species from the remote plasma source to regions of the substrate. A substrate positioning system, 214, can position the substrate, 212, directly under the showerhead, 210. As illustrated in FIG. 2, the substrate positioning system can provide two displaced axes of rotation, 216, and 218. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support, 222, may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support, 222, can include a substrate heater (e.g., resistive or inductive) and can be sized to be larger than the largest substrate to be processed. Substrate temperatures for most remote plasma applications are less than 500 C, although any suitable heater power and range of temperature control. The substrate support, 222, can also be configured to provide a gas purge flow, 224, for example from the edges of the support, using argon, helium, or any other gas that is not reactive under the process conditions.

Figure 3:
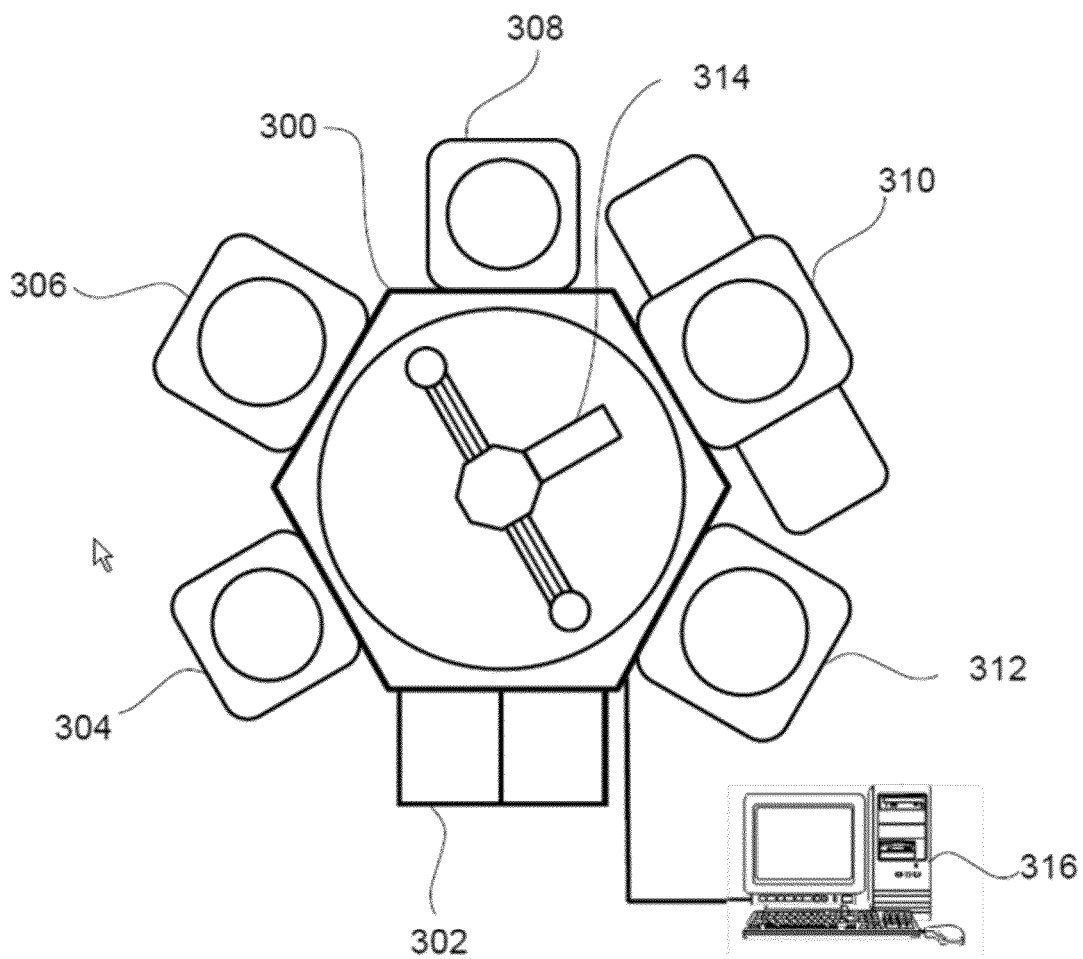
FIG. 3 illustrates a processing system enabling plasma surface treatment according to some embodiments.

FIG. 3 is a simplified schematic diagram illustrating an integrated processing system in accordance with some embodiments of the invention. The processing system includes a frame, 300, supporting a plurality of processing modules. It will be appreciated that frame, 300, may be a unitary frame in accordance with some embodiments. In some embodiments, the environment within frame, 300, is controlled. A load lock, 302, provides access into the plurality of modules of the processing system. A robot, 314, provides for the movement of substrates (and masks) between the modules and for the movement into and out of the load lock, 302. Modules, 304-312, may be any set of modules and preferably include one or more processing modules. For example, module, 304, may be an orientation/degassing module, module, 306, may be a clean module, either plasma or non-plasma based, modules, 308, and/or 310, may be dual purpose modules. Module, 312, may provide conventional clean or degas as necessary.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device, 316, may control the processes of the processing system. Further details of one possible processing system are described in U.S. application Ser. Nos. 11/672,478 and 11/672,473, the entire disclosures of which are herein incorporated by reference. In a processing system, a plurality of methods may be employed to deposit material upon a substrate.

Plasmas are widely used for a variety of treatment and layer deposition tasks in semiconductor fabrication. These applications include subtractive processes such as wafer precleaning, contaminant removal, native oxide removal, photoresist removal, as well as treatment processes such as oxidation, nitridation, or hydridation of a layer both during and after formation. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, the electrons and ions can be removed from the generated plasma using suitable electrode configurations such as a grounded metal showerhead, so that, for example, only atomic radicals and molecule radicals (but not ions) reach the substrate.

The plasma generator for a remote plasma source can use any known means of coupling energy into atoms or molecules to ionize them and create a plasma. The energy source can be, for example, electromagnetic energy such as microwaves, radio frequency energy, or lasers.

Typically, systems using remote plasma sources were designed to treat the entire area of a substrate, such as a 300 mm wafer. Combinatorial processing is difficult and expensive when the entire area of a substrate can only receive a single process variation. Some embodiments of the present invention overcome this limitation by providing a remote plasma source, an associated substrate positioning system, and a site isolation system that allows a selected region of a substrate to be processed while the remaining regions of the substrate are protected from exposure to the plasma and reactive radical species unless or until such exposure is intended.

Accordingly, an apparatus for processing using remote plasma exposure of a substrate is disclosed. The apparatus comprises an outer chamber containing: a remote plasma source, a showerhead, and a transport system comprising a substrate support and capable of positioning the substrate. The plasma exposure process parameters can be varied. The plasma exposure process parameters comprise one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

In some embodiments, methods of varying surface exposure to a plasma or reactive radical species are provided. The methods comprise exposing a substrate to a plasma or reactive radical species from a remote plasma source under a first set of process parameters, and exposing a substrate to a plasma or reactive radical species from a remote plasma source under a second set of process parameters. The process parameters can be varied in a combinatorial manner. Typically, the process parameters comprise one or more of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof.

In some embodiments, a layer can be exposed to a plasma surface treatment, thereby altering at least the layer's thickness. Examples of suitable atoms include O, N, Cl, F, H, and the like. The atoms may be used to remove semiconductor oxide materials from the surface of the substrate Examples of gases that may be used in the remote plasma source to generate the ions or reactive neutral species include $H_2$, $H_2O$, $O_2$, $N_2$, $N_2O$, $NH_3$, $BCl_3$, $NF_3$, and the like. The concentration and composition of the various species generated in the plasma may be varied by varying a number of the process parameters as well as the gas composition. A description of using these parameters to influence the concentration and composition of the various species generated in the plasma may be found in U.S. patent application Ser. No. 14/051,287, filed on Oct. 10, 2013, and claiming priority to U.S. Provisional Application No. 61/780,128, filed on Mar. 13, 2013, each of which is herein incorporated by reference for all purposes.

Figure 4:
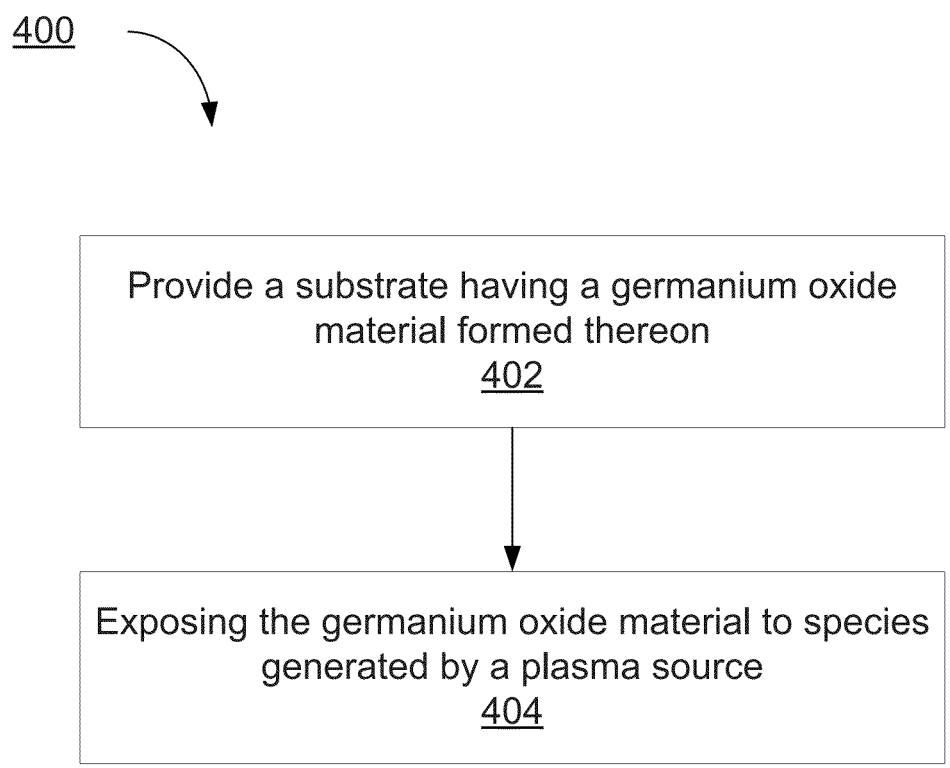
FIG. 4 illustrates a flow chart of a method according to some embodiments.

FIG. 4 illustrates a flow chart of a method according to some embodiments. In step 402, a substrate is provided having a germanium oxide material formed thereon. The germanium oxide material made be formed from a germanium material or a silicon-germanium alloy material. Typically, the germanium oxide has a thickness of about 30 A (as used herein, "A" denotes an Angstrom unit=0.1 nm).

In step 404, the germanium oxide material is exposed to species generated by a plasma source. As discussed previously, the plasma source may include a remote plasma source. The system and plasma source may be employed as described earlier. The species that are generated may include at least one of O, N, Cl, F, or H. Gases that may be used in the remote plasma source to generate the species include $H_2$, $H_2O$, $O_2$, $N_2$, $N_2O$, $NH_3$, $BCl_3$, or $NF_3$. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. In some embodiments, the species include hydrogen species. The hydrogen species may be at least one of ions or neutral species. In some embodiments, the gas used to generate the hydrogen species includes hydrogen gas.

In some embodiments, the hydrogen species react with the germanium oxide (and the silicon oxide if present) material present on the surface of the substrate and effectively remove the oxide material(s). In some embodiments, the hydrogen species react with the cleaned germanium (and the silicon if present) material present on the surface and passivate the surface with Ge—H and/or Si—H bonds. The Ge—H and/or Si—H bonds will serve to retard the re-oxidation of the semiconductor surface. This passivation will allow the queue time (e.g. the wait time until the next process step) to be extended, thus leading to increased manufacturing flexibility and efficiency.

FIG. 5 provides a table of process parameters according to some embodiments. The temperature may vary from about 25 C to about 500 C. Advantageously, the temperature is between about 100 C and about 300 C. The argon (or other inert gas) flow rate may vary between about 10 sccm and about 1000 sccm. Advantageously, the argon (or other inert gas) flow rate is between about 250 sccm and about 750 sccm. In some embodiments, hydrogen gas is used as the source of active hydrogen species from the plasma. The hydrogen gas flow rate may vary from about 10 sccm to about 100 sccm. Advantageously, the hydrogen gas flow rate is between about 10 sccm and about 50 sccm. The pressure may vary between about 50 mTorr and about 5 Torr. Advantageously, the pressure is between about 50 mTorr and about 2 Torr. The surface may be exposed to the reactive species for times between a few seconds (e.g. 25 seconds) to 60 minutes. Typically, the exposure time is on the order of minutes. Advantageously, the exposure time is between about 5 minutes and about 40 minutes.

Samples that included a native silicon oxide at a thickness of about 14-17 A were exposed to active hydrogen species generated from plasma processes that covered the ranges in process parameters discussed previously. The data indicated that several process parameters had an impact on the etching/cleaning rate of the silicon oxide. Generally, higher temperatures (e.g. 300 C-400 C) increased the etching/cleaning rate of the silicon oxide. Generally, higher argon flow rates (e.g. 250 sccm-750 sccm) increased the etching/cleaning rate of the silicon oxide. Without being bound by theory, it is believed that the higher argon flow rates increase the reactive hydrogen species lifetime by decreasing the number of recombination collisions between the reactive hydrogen species. The higher argon flow effectively dilutes the reactive hydrogen species. The longer lifetimes of the reactive hydrogen species results in an increased etching/cleaning rate of the silicon oxide.

Figure 6:
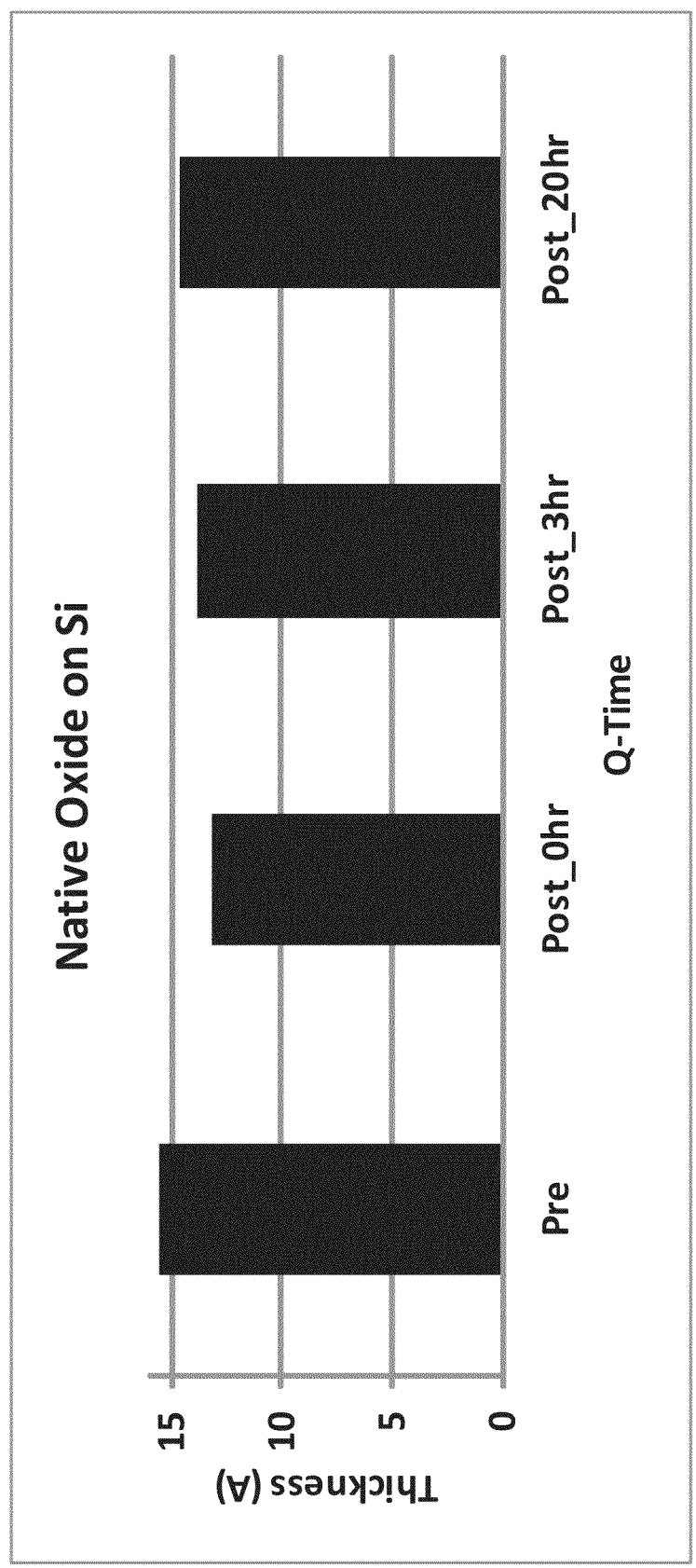
FIG. 6 presents data for thickness versus queue time according to some embodiments.

In addition to etching/cleaning the silicon oxide surface, the reactive hydrogen species also bond to the surface and passivate the surface against further oxidation upon exposure to ambient conditions. FIG. 6 presents data for thickness versus queue time according to some embodiments. Samples that included a native silicon oxide at a thickness of about 14-16 A (i.e. the "Pre" data) were exposed to active hydrogen species generated from plasma processes that covered the ranges in process parameters discussed previously. The thickness of the silicon oxide was measured immediately after the exposure (i.e. the "Post_0 hr" data). The data indicate that about 2 A of silicon oxide was removed for the conditions applied during the exposure. The thickness of the silicon oxide on the samples was remeasured after sitting in ambient air for three hours (i.e. "Post_3 hr" data). The data indicate that less than 1 A of silicon oxide was formed due to the three hour exposure. The thickness of the silicon oxide on the samples was remeasured after sitting in ambient air for twenty hours (i.e. "Post_20 hr" data). The data indicate that less than 2 A of silicon oxide was formed due to the twenty hour exposure. This data indicates that the cleaned/passivated silicon oxide surface is stable against significant silicon oxide growth after exposure to activated hydrogen species generated from a plasma source.

Figure 7:
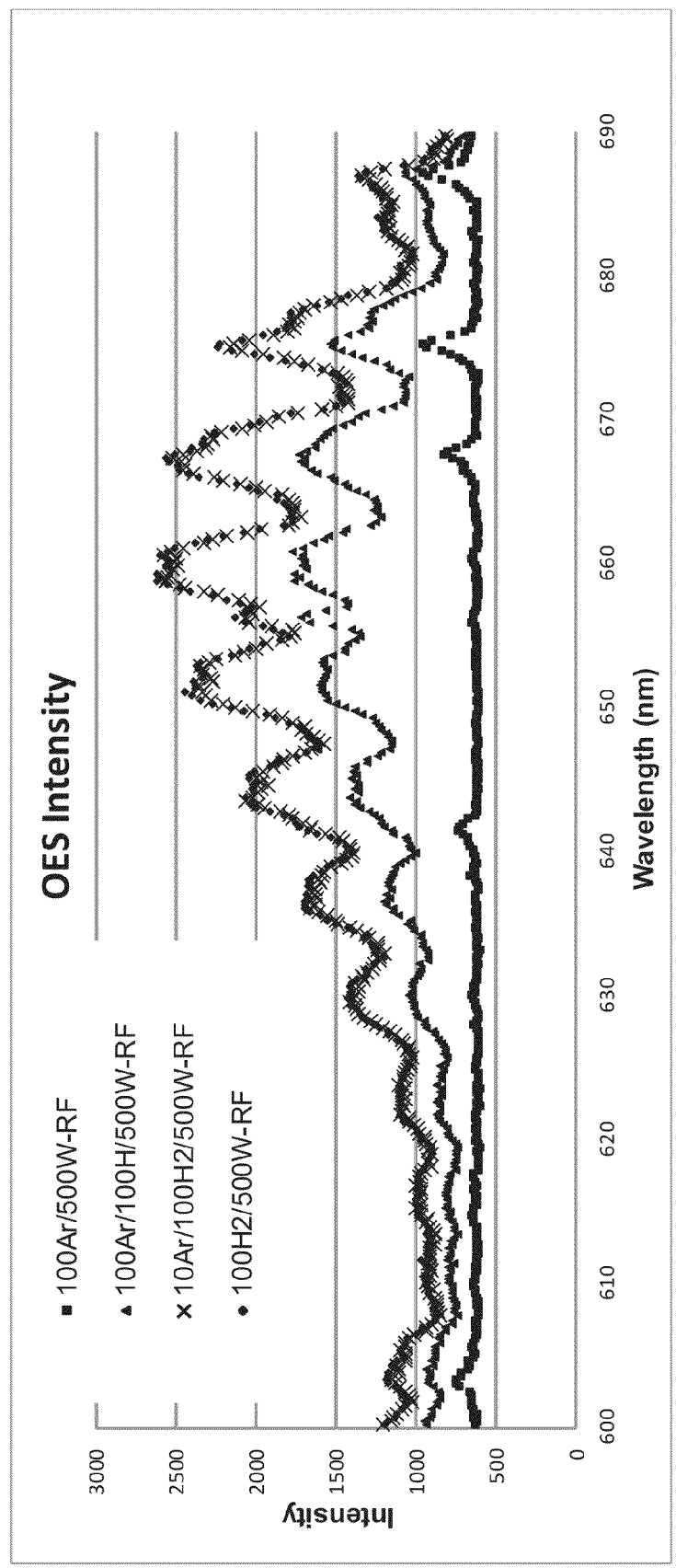
FIG. 7 presents data for optical emission intensity versus wavelength according to some embodiments.

Optical emission spectroscopy (OES) can be used to investigate the concentration and lifetimes of the activated species generated in the plasma. FIG. 7 presents data for optical emission intensity versus wavelength according to some embodiments. The spectra in FIG. 7 present data for several gas compositions and plasma power levels. The data represented by the square symbols presents OES intensity as a function of wavelength for an RF plasma power of 500 W and an argon flow rate of 100 sccm. The data represented by the triangles symbols presents OES intensity as a function of wavelength for a plasma power of 500 W, an argon flow rate of 100 sccm, and a hydrogen flow rate of 100 sccm. The data represented by the X symbols presents OES intensity as a function of wavelength for a plasma power of 500 W, an argon flow rate of 10 sccm, and a hydrogen flow rate of 100 sccm. The data represented by the diamonds symbols presents OES intensity as a function of wavelength for a plasma power of 500 W and a hydrogen flow rate of 100 sccm. Those skilled in the art will understand that the spectrum of the pure argon flow (i.e. the data represented by the square symbols) does not exhibit emission in the wavelength region around 650 nm, while all of the gas flows that contain hydrogen exhibit emission in the wavelength region around 650 nm. Therefore, this wavelength region may be used to investigate the concentration and lifetimes of the activated hydrogen species generated in the plasma without interference from emission from activated argon species.

Figure 8:
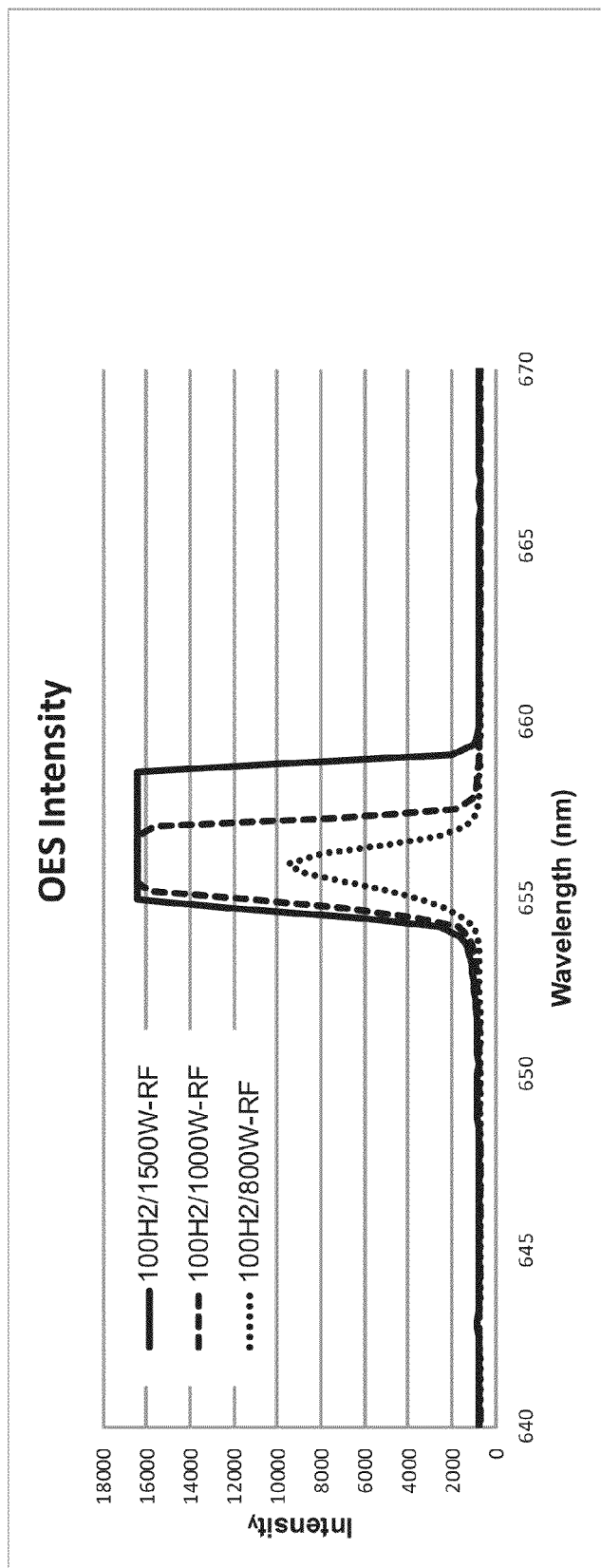
FIG. 8 presents data for optical emission intensity versus wavelength according to some embodiments.

FIG. 8 presents data for optical emission intensity versus wavelength according to some embodiments. OES data were collected in the wavelength region around 650 nm for pure hydrogen gas flows (e.g. no argon) at several different plasma power settings. The data represented by the solid line presents OES intensity as a function of wavelength for a plasma power of 1500 W and a hydrogen flow rate of 100 sccm. The data represented by the dashed line presents OES intensity as a function of wavelength for a plasma power of 1000 W and a hydrogen flow rate of 100 sccm. The data represented by the dotted line presents OES intensity as a function of wavelength for a plasma power of 800 W and a hydrogen flow rate of 100 sccm. These data indicate that higher concentrations (i.e. as evidenced by an increase in intensity) of activated hydrogen species are generated as the plasma power is increased.

Figure 9:
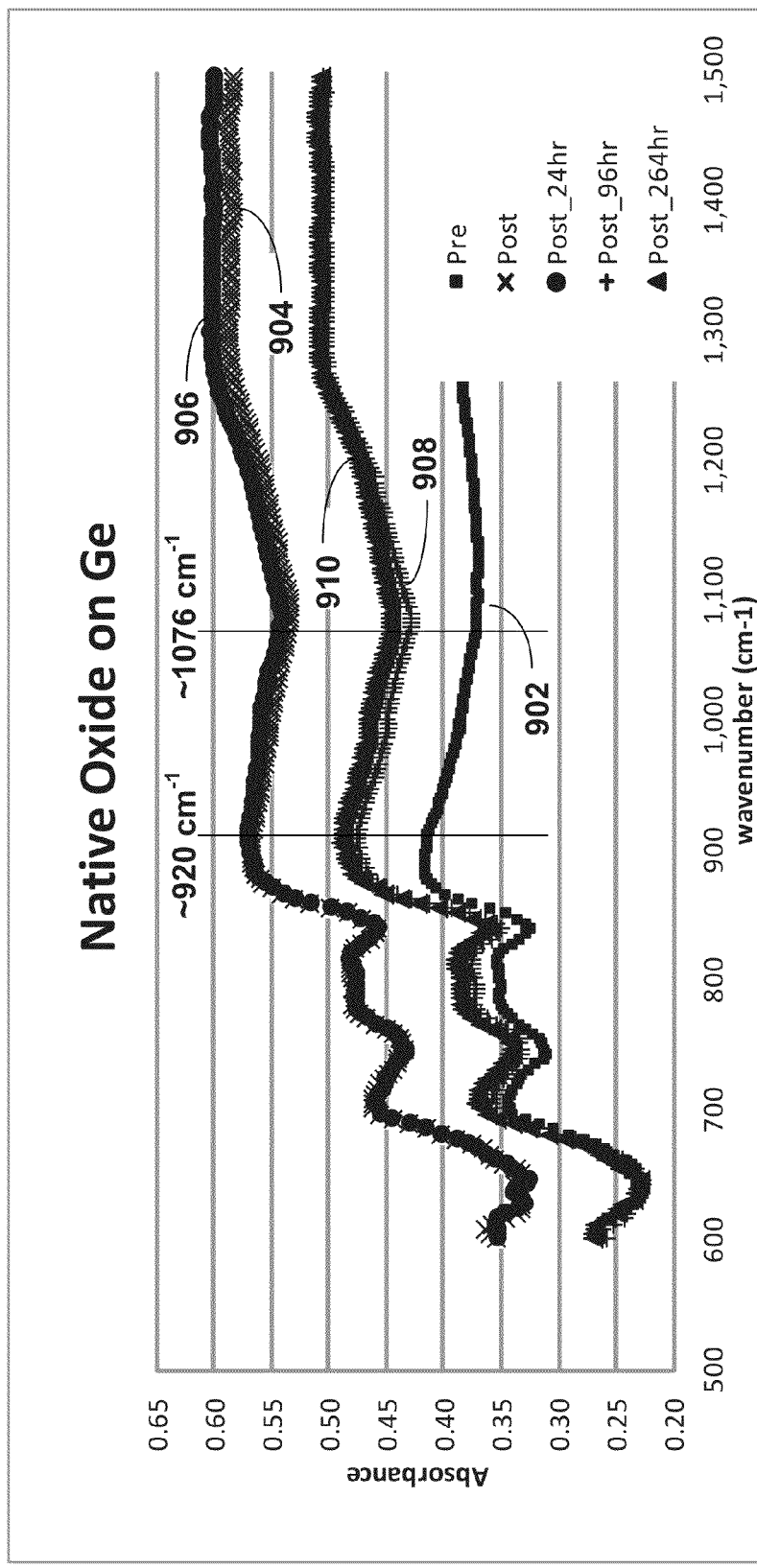
FIG. 9 presents data for absorbance versus wavenumber according to some embodiments.

Germanium oxidizes more easily than silicon when exposed to ambient conditions. Further, the germanium oxides exhibit reduced stability when compared to the silicon oxides. Therefore, germanium oxide can be more easily etched/cleaned when exposed to activated hydrogen species from a plasma source. The range of process conditions is similar to those discussed previously with respect to FIG. 5. Similar to silicon oxide, activated hydrogen species have been found to act as an effective passivation on the surface of etched/cleaned germanium oxide and can prevent further oxidation when the surfaces are exposed to ambient air. Fourier transform infrared spectroscopy (FTIR) can be used to investigate and monitor the reaction of cleaned germanium surfaces with ambient air to form native germanium oxide layers. FIG. 9 presents data for absorbance versus wavenumber ($cm^{-1}$) according to some embodiments. FTIR spectra were obtained in a spectral region between about 500 wavenumbers and about 4000 wavenumbers. Specifically, the spectral region of interest for investigating germanium oxide lies in the region between about 920 wavenumbers and about 1076 wavenumbers. Typically, quantitative data can be obtained by integrating the absorbance within this wavenumber region. Alternatively, a "figure of merit" can be obtained by calculating the absolute difference in the absorbance at 920 wavenumbers and the absorbance at 1076 wavenumbers (i.e. absolute value of Abs(920 $cm^{-1}$)–Abs(1076 $cm^{-1}$)). To guide the reader's eye, markers have been placed within FIG. 9 to indicate the absorbance values used to calculate the FoM. The data represented by the square symbols, 902, (i.e. "Pre") presents absorbance data as a function of wavenumber for a substrate having a native oxide of germanium oxide at a thickness of about 31 A. The sample was exposed to activated hydrogen species from a plasma source using the process parameters discussed previously. In some embodiments, the temperature was about 180 C, the argon flow rate was about 500 sccm, the hydrogen flow rate was about 20 sccm, the pressure was about 1 Torr, and the exposure time was about 40 minutes. Thickness measurements indicate that about 19 A of germanium oxide were removed during the exposure. The data represented by the "X" symbols, 904, (i.e. "Post") presents absorbance data as a function of wavenumber for the substrate immediately after the exposure to the activated hydrogen species. The data represented by the circle symbols, 906, (i.e. "Post_24 hr) presents absorbance data as a function of wavenumber for the substrate after 24 hours of exposure to ambient air after the exposure to the activated hydrogen species. The data represented by the "+" symbols, 908, (i.e. "Post_96 hr) presents absorbance data as a function of wavenumber for the substrate after 96 hours of exposure to ambient air after the exposure to the activated hydrogen species. The data represented by the triangle symbols, 910, (i.e. "Post_264 hr) presents absorbance data as a function of wavenumber for the substrate after 264 hours of exposure to ambient air after the exposure to the activated hydrogen species. Those skilled in the art will understand that the FoM (as calculated above) for the "Post" and "Post_24 hr" samples are much lower than the "Pre" samples, indicating a reduction in the thickness of the germanium oxide.

Figure 10:
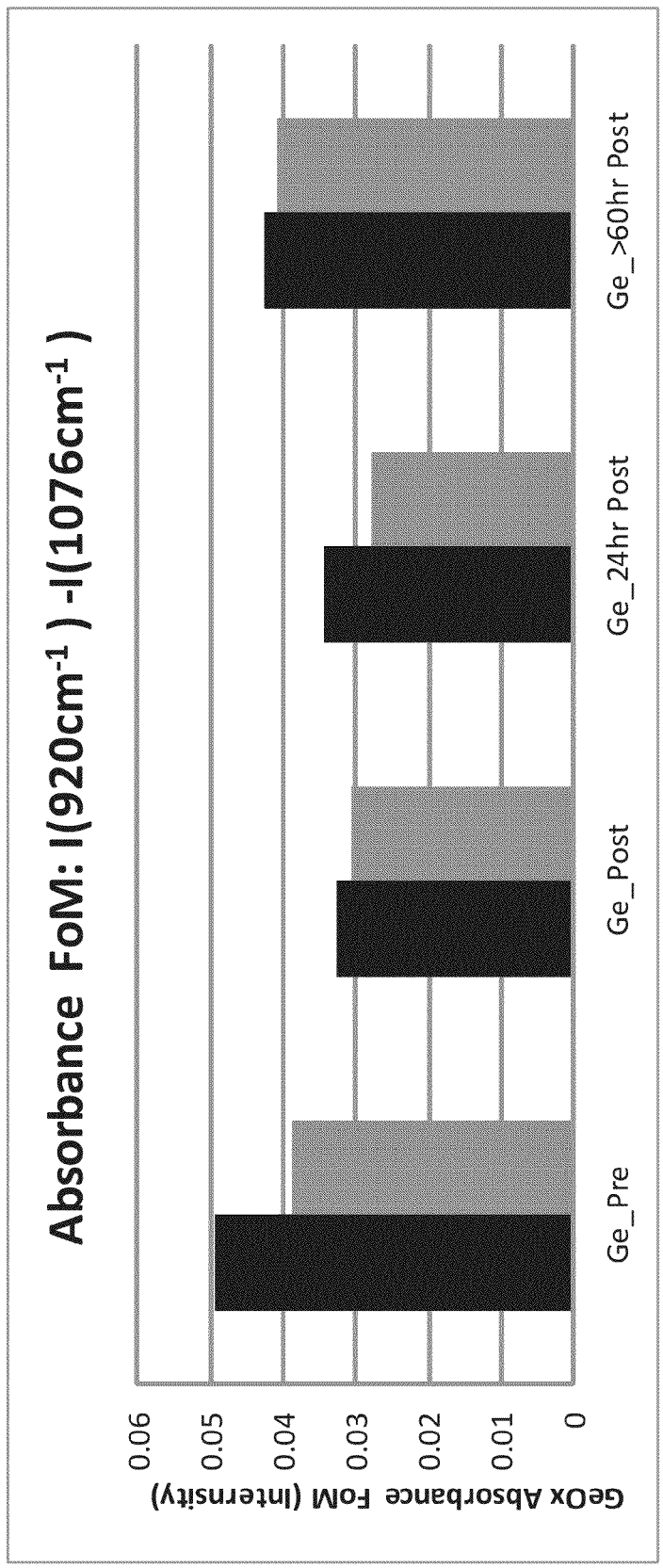
FIG. 10 presents data for absorbance versus queue time according to some embodiments.

A "figure of merit" (FoM) can be obtained by calculating the absolute difference in the absorbance at 920 wavenumbers and the absorbance at 1076 wavenumbers (i.e. absolute value of Abs(920 cm$^{-1}$)–Abs(1076 cm$^{-1}$)). FIG. 10 presents data for the FoM of absorbance versus queue time according to some embodiments. The data in FIG. 10 compare the germanium oxide growth of samples that were cleaned in different plasma processing chambers as a function of exposure time to ambient air after an activated hydrogen cleaning process. FIG. 10 presents data for integrated absorbance between about 920 wavenumbers and 1076 wavenumbers versus queue time according to some embodiments. Samples that included a native oxide of germanium oxide at a thickness of about 31 A (i.e. the "Ge_Pre" data) were exposed to active hydrogen species generated from plasma processes that covered the ranges in process parameters discussed previously. The absorbance of the germanium oxide was measured immediately after the exposure (i.e. the "Ge_Post" data). The data indicate that germanium oxide was removed for the conditions applied during the exposure. The absorbance of the germanium oxide on the samples was remeasured after sitting in ambient air for 24 hours (i.e. "Ge_24 hr Post" data). The data indicate that very little germanium oxide was formed due to the 24 hour exposure. The absorbance of the germanium oxide on the samples was remeasured after sitting in ambient air for 60 hours (i.e. "Ge_≥60 hr Post" data). The data indicate that little germanium oxide was formed due to the 60 hour exposure. This data indicates that the cleaned/passivated germanium oxide surface is stable against significant germanium oxide growth after exposure to activated hydrogen species generated from a plasma source. These data also indicate that the process is repeatable and can be performed in different chambers and will yield similar results. These repeatability data indicate that the process would be applicable to high volume manufacturing.

Figure 11A:
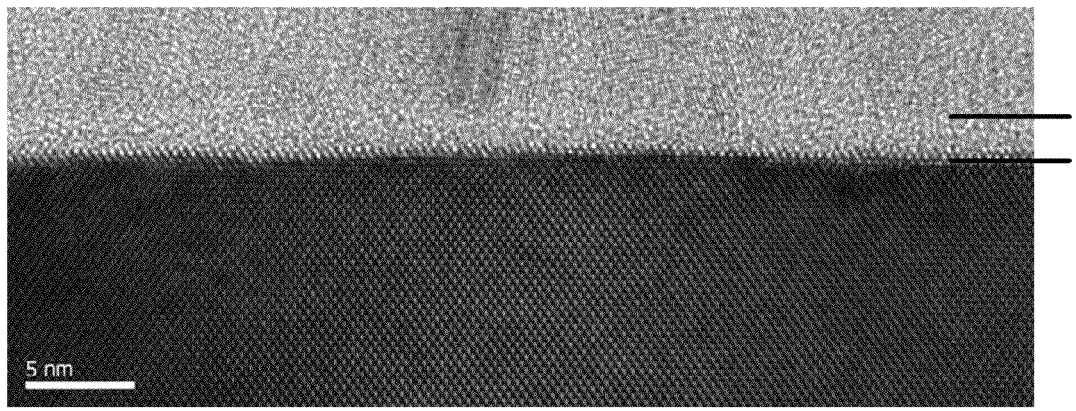
FIGS. 11A and 11B present transmission electron microscopy (TEM) micrographs according to some embodiments.
Figure 11B:
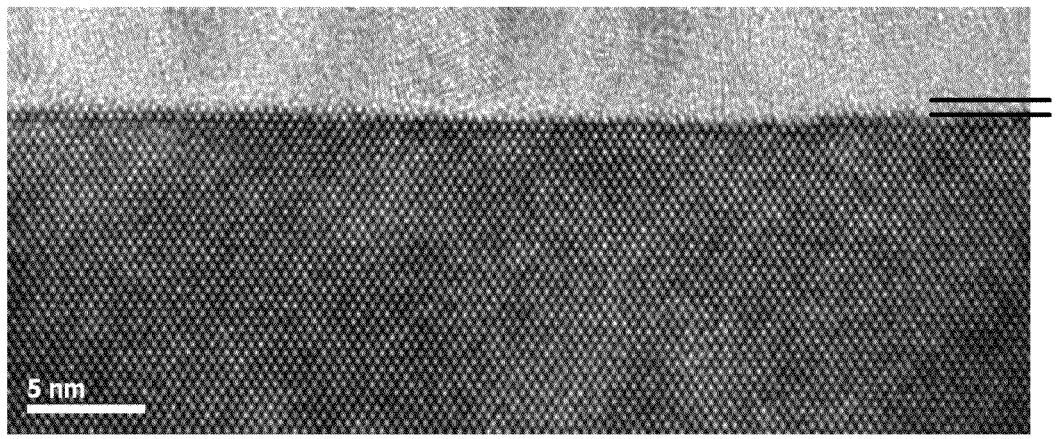

FIGS. 11A and 11B present transmission electron microscopy (TEM) micrographs according to some embodiments. FIG. 11A presents a TEM micrograph of a germanium substrate that includes a native germanium oxide formed thereon. To guide the eye of the reader, the thickness of the native germanium oxide is indicated by the two lines at the right side of the micrograph. FIG. 11B presents a TEM micrograph of the germanium substrate after being exposed to active hydrogen species generated from plasma processes that covered the ranges in process parameters discussed previously. To guide the eye of the reader, the thickness of the remaining native germanium oxide is indicated by the two lines at the right side of the micrograph. The micrographs in FIGS. 11A and 11B are taken at the same magnification. These micrographs clearly demonstrate the reduction in the thickness of the germanium oxide layer after being exposed to active hydrogen species generated from plasma processes as discussed previously.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for etching a layer in a combinatorial manner, the method comprising:
   providing a metal-oxide semiconductor (MOS) device comprising a p-doped substrate having a plurality of site-isolated regions for discrete processing,
     wherein the substrate comprises a conductive gate electrode separated from an n-doped well by a gate dielectric,
     wherein the gate dielectric comprises a semiconductor oxide layer formed on the substrate,
     wherein the semiconductor oxide layer is a hafnium oxide layer,
     wherein the substrate further comprises a germanium oxide layer formed on the substrate beneath the gate dielectric;
   generating activated hydrogen species using a remote plasma source and a gas,
     wherein the hydrogen species is at least one of ions or neutral species,
     wherein the gas used to generate the activated hydrogen species includes hydrogen gas;
   exposing the semiconductor oxide layer to the activated hydrogen species,
     wherein the activated hydrogen species reacts with the germanium oxide material to remove at least a portion of the semiconductor oxide layer from the substrate.

2. The method of claim 1, further comprising
   exposing a cleaned germanium material present on a surface of the substrate after removal of the at least a portion of the semiconductor oxide layer to the activated hydrogen species,
     wherein the activated hydrogen species reacts with the cleaned germanium material to passivate the surface with Ge—H bonds
     wherein the Ge—H bonds retard re-oxidation of the surface, allowing extended queue time prior to subsequent processing steps.

3. The method of claim 2, further comprising
   exposing the cleaned germanium material on the surface of the substrate to ambient air after the exposure to the activated hydrogen species,
   measuring absorbance of the germanium oxide on the surface of the substrate as a function of exposure to time to ambient air after an activated hydrogen cleaning process.

4. The method of claim 1, wherein the exposing the semiconductor oxide layer to the activated hydrogen species is performed at a temperature between about 100 C and about 500 C.

5. The method of claim 4, wherein the exposing the semiconductor oxide layer to the activated hydrogen species is performed at a temperature between about 100 C and about 300 C.

6. The method of claim 1, wherein the exposing the semiconductor oxide layer to the activated hydrogen species further comprises exposure to an inert gas.

7. The method of claim 6, wherein the inert gas is one of helium, neon, argon, krypton, and xenon.

8. The method of claim 7, wherein the inert gas is argon and the argon is flowed at a rate between 10 sccm and 1000 sccm.

9. The method of claim 8, wherein the argon is flowed at a rate between about 250 sccm and about 750 sccm.

10. The method of claim 1, wherein the exposing the semiconductor oxide layer to the activated hydrogen species is performed at a pressure between about 0.5 Torr and about 5 Torr.

11. The method of claim 10, wherein the exposing the semiconductor oxide layer to the activated hydrogen species is performed at a pressure between about 0.5 Torr and about 2 Torr.

12. The method of claim 1, wherein the exposing the semiconductor oxide layer to the activated hydrogen species is performed for a time between about 25 seconds and 60 minutes.

13. The method of claim 12, wherein the exposing the semiconductor oxide layer to the activated hydrogen species is performed for a time between 5 minutes and 40 minutes.

14. The method of claim 1, wherein the germanium oxide layer has a thickness of about 30 Angstrom units.

15. The method of claim 1, wherein the hydrogen gas is flowed at a rate between about 10 sccm and about 100 sccm.

16. The method of claim 15, wherein the hydrogen gas is flowed at a rate between about 10 sccm and about 50 sccm.

17. The method of claim 1, wherein the germanium oxide layer is formed from one of a germanium material or a silicongermanium alloy material.

18. A method for cleaning a layer in a combinatorial manner, the method comprising:
providing a metal-oxide semiconductor (MOS) device comprising a p-doped substrate having a plurality of site-isolated regions for discrete processing,
wherein the substrate comprises a conductive gate electrode separated from an n-doped well by a gate dielectric,
wherein the gate dielectric comprises a semiconductor oxide layer formed on the substrate,
wherein the semiconductor oxide layer is one of a hafnium oxide or a silicon dioxide layer,
wherein the substrate further comprises a germanium oxide layer formed on the substrate beneath the gate dielectric;
generating activated hydrogen species using a remote plasma source and a gas,
wherein the hydrogen species is at least one of ions or neutral species,
wherein the gas used to generate the activated hydrogen species includes hydrogen gas;
exposing the germanium oxide layer to the activated hydrogen species,
wherein the activated hydrogen species reacts with the germanium oxide material to remove at least a portion of the germanium oxide layer from the substrate, and
exposing a cleaned germanium material present on a surface of the substrate after removal of the at least a portion of the semiconductor oxide layer to the activated hydrogen species,
wherein the activated hydrogen species reacts with the cleaned germanium material to passivate the surface with Ge—H bonds,
wherein the Ge—H bonds retard re-oxidation of the surface, allowing extended queue time prior to subsequent processing steps,
wherein the exposing the germanium oxide layer to the activated hydrogen species is performed at a temperature between 100 C and 300 C,
wherein the exposing the germanium oxide layer to the activated hydrogen species further comprises flowing argon and the argon is flowed at a rate between about 250 sccm and about 750 sccm,
wherein the hydrogen gas is flowed at a rate between 10 sccm and 100 sccm,
wherein the exposing the semiconductor oxide layer to the activated hydrogen species is performed at a pressure between about 0.5 Torr and about 2 Torr, and
wherein the exposing the semiconductor oxide layer to the activated hydrogen species is performed for a time between about 5 minutes and about 40 minutes.

19. The method of claim 18, wherein the germanium oxide layer has a thickness of about 30 Angstrom units.

20. The method of claim 18, wherein the semiconductor oxide layer on the substrate is a hafnium oxide layer.

* * * * *